United States Patent [19]
Huynh et al.

[11] Patent Number: 6,084,782
[45] Date of Patent: Jul. 4, 2000

[54] ELECTRONIC DEVICE HAVING SELF-ALIGNING SOLDER PAD DESIGN

[75] Inventors: Due Huynh, Lawrenceville; Diann J. Beesch, Winder, both of Ga.; Todd L. Smith, Hillsboro, Oreg.

[73] Assignee: Motorola, Inc., Schaumburg, Ill.

[21] Appl. No.: 08/867,501

[22] Filed: Jun. 2, 1997

[51] Int. Cl.[7] .................................................. H05K 7/06
[52] U.S. Cl. ..................... 361/777; 361/749; 174/260; 174/261; 29/834; 228/180.21
[58] Field of Search ....................... 361/779, 749, 361/751, 767, 774, 777, 808; 228/180.21; 174/260, 261, 259; 29/834

[56] References Cited

U.S. PATENT DOCUMENTS

| | | |
|---|---|---|
| 4,164,778 | 8/1979 | Sawairi et al. ............................ 361/777 |
| 4,605,153 | 8/1986 | Van Den Brekel et al. ...... 228/180.22 |
| 4,641,222 | 2/1987 | Derfiny et al. ........................... 174/255 |
| 4,645,114 | 2/1987 | Van Den Brekel et al. ...... 228/180.21 |
| 4,836,435 | 6/1989 | Napp et al. ......................... 228/180.22 |
| 5,011,066 | 4/1991 | Thompson ......................... 228/180.21 |
| 5,311,405 | 5/1994 | Tribbey et al. .......................... 361/748 |
| 5,449,110 | 9/1995 | Tsuji et al. ......................... 228/180.21 |
| 5,453,581 | 9/1995 | Liebman et al. ........................ 174/261 |

*Primary Examiner*—Leo P. Picard
*Assistant Examiner*—John B. Vigushin
*Attorney, Agent, or Firm*—Felipe J. Farley

[57] ABSTRACT

A substrate (200) to which a component (210) is mounted includes at least two mounting pads (215, 220) formed thereon for electrically coupling to a single terminal of the component (210) and for aligning the component (210) on the substrate (200) during a reflow operation.

6 Claims, 2 Drawing Sheets

ID SELF-
ALIGNING SOLDER PAD DESIGN

TECHNICAL FIELD

This invention relates in general to electronic devices, and more specifically to solder pad designs for electronic devices having surface mounted components.

BACKGROUND

Electronic devices often include surface mounted parts that are placed on a substrate then bonded to solder pads during a solder reflow process in which heat is applied to the substrate. Conventionally, a surface mounted part is placed onto the substrate, then solder disposed between the solder pads and the part liquefies during the reflow process. The substrate is then cooled, and the solder hardens to bond terminals of the part to solder pads of the substrate.

A surface mounted part can easily be placed incorrectly on the substrate during the assembly process, in which case the part can be bonded in an incorrect orientation, resulting in mechanical and electrical defects. To solve this problem, a fixture can be designed to hold the part in place during reflow. Alternatively, a top pallet can be constructed with cutouts for the surface mounted parts. The top pallet is laid over the substrate to eliminate part movement during reflow. Both of these solutions can be expensive and labor-intensive, however, and this cost is often passed on to the customer in the form of increased product costs.

Thus, what is needed is a better way to properly align components in an electronic device.

DETAILED DESCRIPTION OF THE PREFERRED EMBODIMENT

Figure 1:
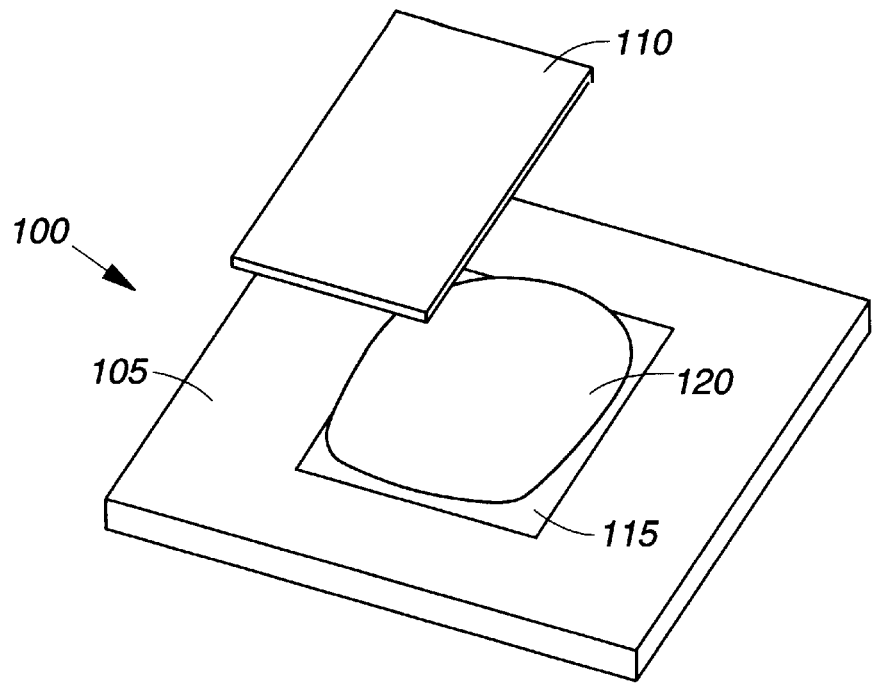
FIG. 1 is a perspective view of an electronic device having a conventional solder pad design.

While the specification concludes with claims defining the features of the invention that are regarded as novel, it is believed that the invention will be better understood from a consideration of the following description in conjunction with the drawing figures, in which like reference numerals are carried forward.

FIG. 1 illustrates a prior art solder pad design for mounting components 110 to a substrate 105 included in an electronic device 100, such as a battery, portable radio, or any other device that includes surface mountable electronic components. The surface mountable components include one or more electrical terminals for providing electrical signals to and from the components, and each electrical terminal generally has a single corresponding mounting pad, such as the mounting pad 115, formed on the substrate 105. During the assembly process, solder 120 is disposed on mounting pads 115, subsequent to which the components 110 are placed onto the substrate 105 and coupled thereto during a reflow operation. During reflow, the assembly is heated until the solder 120 liquefies and adheres to a terminal of the component 110 and the corresponding mounting pad 115. Subsequently, the assembly is cooled so that a mechanical and electrical bond is formed between the component 110 and the substrate 105 via the mounting pad 115 and the component terminal.

Figure 2:
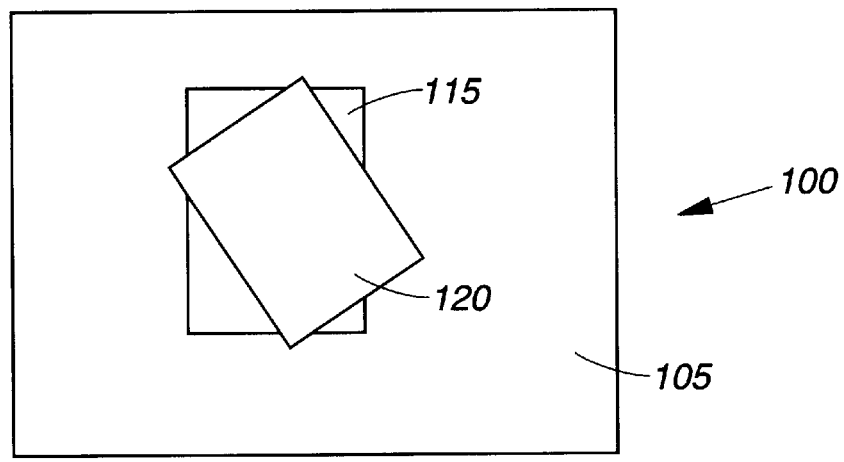
FIG. 2 is a top view of component misalignments that can occur using the conventional solder pad design of FIG. 1.

A problem with the prior art solder pad design is that the component 110 can easily become misaligned during the solder reflow process, particularly if the component 110 is not. As shown in FIG. 2, misalignment of the component 110 can result in the component 110 being skewed on the mounting pad 115. The skewed component 110 can interfere with other parts (not shown) to cause breakage or malfunction of the electronic device 100. For instance, when the component 110 comprises an electrical contact that must fit within openings of a device housing, skewing can prevent proper placement of the substrate 105 within the housing.

Figure 3:
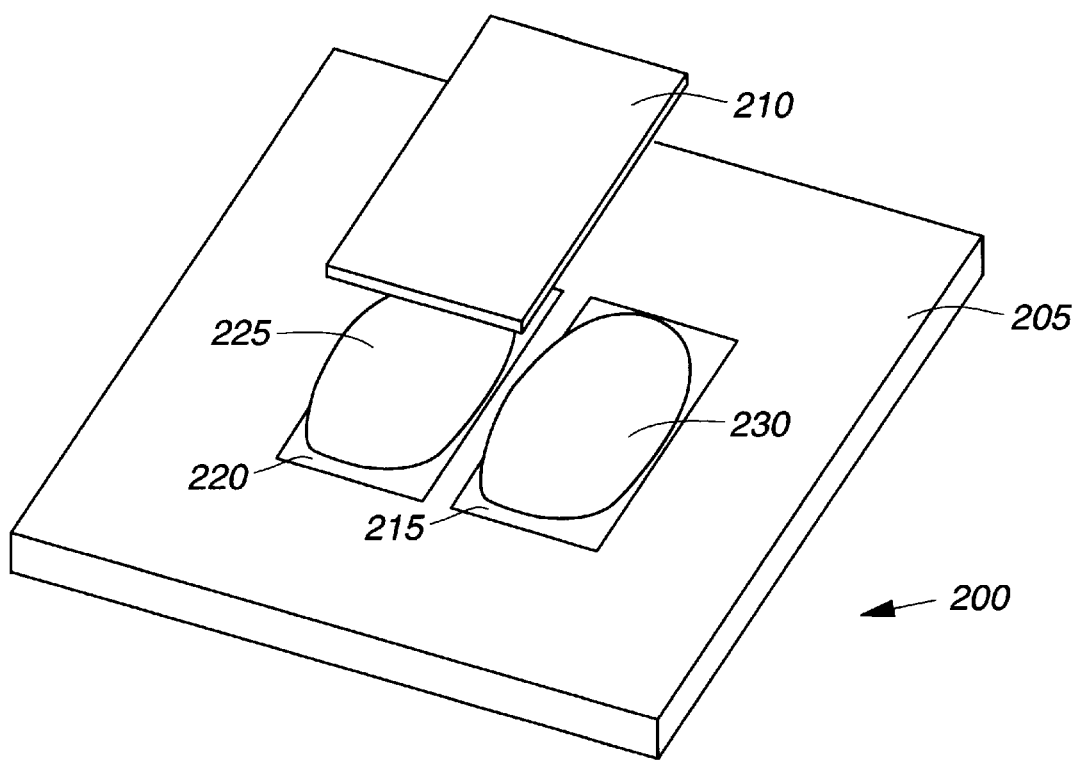
FIG. 3 is a perspective view of an electronic device including a solder pad design according to the present invention.

FIG. 3 illustrates an electronic device 200, e.g., a battery or other device having one or more surface mounted parts, including a substrate 205 on which a component 210 is surface mounted. The substrate 205 can, for instance, be a printed circuit board or a flexible substrate. The component 210 can be, for example, an electrical contact or other part that includes a single mounting terminal, i.e., a single part location for mounting to the substrate 205. Although, when the component 210 is a simple electrical contact, the component 210 includes only a single electrical terminal, two mounting pads 215, 220 are formed on the substrate 205 for bonding with the terminal of the component 210. Preferably, the two mounting pads 215, 220 are separate, and solder 225, 230 disposed on the respective pads 215, 220 does not flow across the substrate 205 to connect the two pads 215, 220.

During assembly of the electronic device 200, the component 210 is placed onto the solder 225, 230 disposed on the mounting pads 215, 220 without the use of a fixture to hold the component 210 or a top pallet for limiting movement of the component 210. The substrate 205 is then heated to liquefy the solder 225, 230 such that the component 210 floats on top of two pads 215, 220, rather than on one, as would be the case in prior art designs. The surface tension exerted by the solder 225, 230 on the two pads 215, 220 creates equal and opposite rotational forces on the component 210, thereby aligning the component 210 to its proper orientation. This pad design will realign the component 210 properly regardless of whether the component 210 is initially misaligned during placement. It can therefore be appreciated that the solder pad design according to the present invention reduces the likelihood of device defects resulting from part misalignments, which decreases product and labor costs.

Although the component 210 is described as being an electrical contact having a single terminal for bonding to the substrate 205, the solder pad design according to the present invention is also applicable to parts having multiple terminals that bond to the substrate 205. By way of example, a two terminal surface mountable device, such as a resistor, would be conventionally bonded to a substrate using a total of two mounting pads. One mounting pad would bond with a first resistor terminal, while the other mounting pad would bond with the second resistor terminal. According to the present invention, each resistor terminal would instead be placed on and bonded to two mounting pads, thus providing for more accurate component alignment during reflow.

Figure 4:
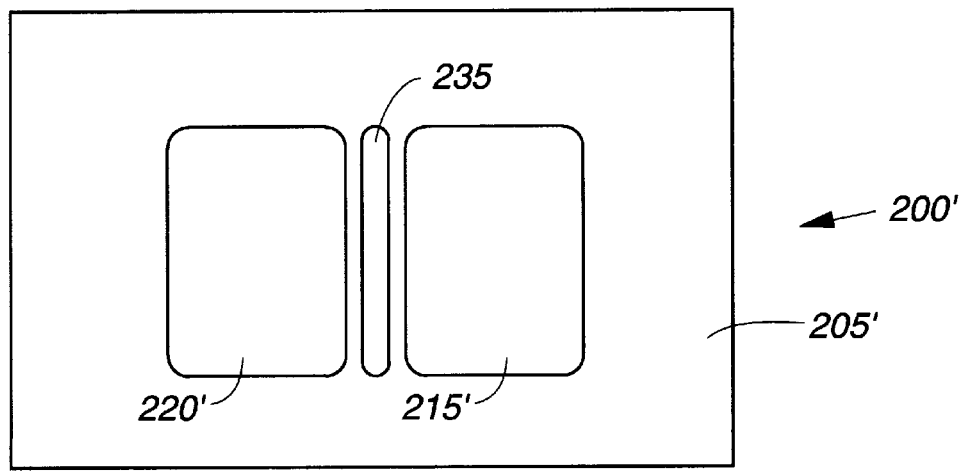
FIG. 4 is a top view of an electronic device having a solder pad design for relieving stresses on a flexible substrate according to the present invention.

Referring next to FIG. 4, a stress relieving solder pad design is illustrated. Many electronic devices, such as device

200', include a flexible substrate 205' that can be bent to fit easily within a device housing. Although this flexibility is advantageous during device assembly, bending of a conventional flexible substrate can cause warping of mounting pads. In severe situations, metal plating on the pads can even peel away from a conventional flexible substrate.

The flexible substrate 205', however, includes a slit 235 in the substrate 205' between the mounting pads 215', 220'. Preferably, the slit 235 runs at least the length of the mounting pads 215', 220'. In a multi-layer substrate 205', the slit 235 can be formed through one or more layers rather than through the entire substrate 205'. During bending of the flexible substrate 205', the slit 235 relieves stresses on the mounting pads 215', 220' so that the pads 215', 220' do not warp, and metal plating is not peeled away from the substrate 205'. As a result, the stress relieving solder pad design shown in FIG. 4 creates a more reliable, less expensive electronic device 200' than is the case with conventional pad designs.

In summary, the electronic device described above includes two mounting pads for coupling to a single terminal of a surface mounted component. Consequently, during a solder reflow process, the component is pulled into proper alignment by equal and opposite rotational forces exerted on the component. An advantage of this design is that alignment defects are conveniently eliminated without the added expense and time required for using fixtures and pallets that are conventionally used for aligning surface mounted parts.

When the electronic device of the present invention includes a flexible substrate, a stress relieving slit in the substrate is formed between the two mounting pads so that, when the flexible substrate is bent, pad warping does not occur. In conventional devices, on the other hand, stresses on mounting pads can cause the metal plating to peel away from the substrate, resulting in both mechanical and electrical defects.

It will be appreciated by now that there has been provided a more reliable solder pad design for use in electronic devices that include surface mounted components.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A flexible substrate to which a component is mounted, the substrate comprising:

at least two mounting pads formed thereon for electrically coupling to a single terminal or the component and for aligning the component on the substrate during a reflow operation, wherein the at least two mounting pads comprise two mounting pads, and the flexible substrate has a slit formed therethrough between the two mounting pads.

2. The flexible substrate of claim 1, wherein each of the two mounting pads has a length, and the slit extends the length of the two mounting pads.

3. An electronic device, comprising:

a flexible substrate;

a component having at least one electrical terminal; and at least two mounting pads formed on the substrate for electrically coupling to a single terminal of the component and for aligning the component on the substrate during a reflow operation;

wherein the at least two mounting pads comprise two mounting pads, and the flexible substrate has a slit formed therethrough between the two mounting pads.

4. The electronic device of claim 3, wherein each of the two mounting pads has a length, and the slit extends the length of the two mounting pads.

5. An electronic device, comprising:

a flexible substrate;

a component having a single electrical terminal; and two mounting pads formed on the flexible substrate for electrically coupling to the single electrical terminal of the component and for aligning the component on the flexible substrate during a reflow operation;

wherein the flexible substrate has a slit formed therethrough between the two mounting pads.

6. The electronic device of claim 5, wherein each of the two mounting pads has a length, and the slit extends the length of the two mounting pads.

* * * * *